United States Patent [19]

Akram

[11] Patent Number: 4,521,898
[45] Date of Patent: Jun. 4, 1985

[54] RIPPLE COUNTER CIRCUIT HAVING REDUCED PROPAGATION DELAY

[75] Inventor: M. Faheem Akram, Mesa, Ariz.

[73] Assignee: Motorola, Inc., Schaumburg, Ill.

[21] Appl. No.: 453,974

[22] Filed: Dec. 28, 1982

[51] Int. Cl.³ .............................................. H03K 23/26
[52] U.S. Cl. .................................. 377/116; 377/106; 377/119
[58] Field of Search ............... 377/116, 117, 119, 120, 377/121, 127, 103, 106, 111, 115

[56] References Cited

U.S. PATENT DOCUMENTS

| | | | |
|---|---|---|---|
| 3,422,254 | 1/1969 | Lundin | 377/116 |
| 3,493,872 | 2/1970 | Sebe | 377/116 X |
| 3,517,318 | 6/1970 | McDermond | 377/116 |
| 3,596,186 | 7/1971 | Berney | 377/116 X |
| 3,943,378 | 3/1976 | Beutler | 377/117 |
| 4,406,014 | 9/1983 | Doron | 377/116 X |

*Primary Examiner*—Stanley D. Miller
*Assistant Examiner*—David R. Bertelson
*Attorney, Agent, or Firm*—William E. Koch

[57] ABSTRACT

A ripple counter circuit is provided that reduces propagation delay inherent in flip-flops, and therefore, reduces the current required. A first flip-flop has a clock input responsive to a clock signal and a D input connected to a $\overline{Q}$ output. A second flip-flop has a clock input ANDed to a Q output of the first flip-flop and the clock signal. A propagation delay normally associated with the first flip-flop is eliminated from the Q output of the second flip-flop.

4 Claims, 4 Drawing Figures

RIPPLE COUNTER CIRCUIT HAVING REDUCED PROPAGATION DELAY

BACKGROUND OF THE INVENTION

1. Field of the Invention

This invention relates, in general, to counters and more particularly to ripple counters having a reduced propagation delay.

2. Background Art

Known ripple counters having "D" type flip-flops comprise a first flip-flop having a clock input responsive to a clock pulse, and a D input responsive to a $\overline{Q}$ output. A clock input of a second flip-flop is responsive to a Q output of the first flip-flop, and a D input of the second flip-flop is responsive to a $\overline{Q}$ output of the second flip-flop. A Q output of the second flip-flop may clock a third flip-flop in a similar manner, with the number of flip-flops so connected determined by the desired count length, or divider ratio. Each flip-flop serially connected in this manner introduces a propagation delay between the first clock input and the last Q output. This propagation delay can be reduced by operating the flip-flops at higher bias currents.

Circuitry requiring low currents, such as the Electronic Telephone Chip (ETC) which includes a Dual Tone Multifrequency (DTMF) Generator For Touch Tone Dialing, may require that the current for each gate be limited. I$^2$L technology used in such circuitry has speed limitations, such that more current is needed for lower propagation delays. When a ripple counter as described above is used to implement a programmable counter, the propagation delay of the flip-flops becomes the limiting factor in determining the highest clock frequency.

Therefore, what is needed is a flip-flop circuit having reduced propagation delay and a reduced total current requirement.

SUMMARY OF THE INVENTION

Accordingly, it is an object of the present invention to provide an improved ripple counter circuit.

Another object of the present invention is to provide a ripple counter circuit having reduced propagation delay.

A further object of the present invention is to provide a ripple counter circuit that operates at reduced current levels.

In carrying out the above and other objects of the invention in one form, there is provided an improved ripple counter circuit including a first flip-flop having a clock input responsive to a clock signal and a D input connected to a $\overline{Q}$ output. A second flip-flop has a clock input wired ANDed to a Q output of the first flip-flop and the clock signal, thereby avoiding the propagation delay of the first flip-flop.

The above and other objects, features, and advantages of the present invention will be better understood from the following detailed description taken in conjunction with the accompanying drawings.

DETAILED DESCRIPTION OF THE INVENTION

Figure 1:
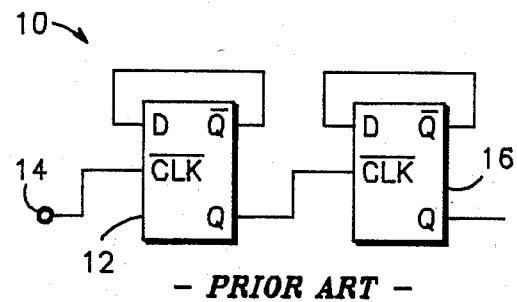
FIG. 1 is a block diagram of a known ripple counter circuit using D-type flip-flops.

Referring to FIG. 1, a typical ripple counter circuit 10 includes a first flip-flop 12 having a clock input $\overline{CLK}$ connected to terminal 14 and responsive to a clock signal. Flip-flop 16 has a clock input $\overline{CLK}$ connected to an output Q of flip-flop 12. Both flip-flops 12, 16 each have an output $\overline{Q}$ connected to their respective input D. It is obvious to those skilled in the art that a "D" type flip-flop so connected functions as a toggle flip-flop. Therefore, the ripple counter circuit 10 may comprise toggle flip-flops in place of "D" type flip-flops. Output Q of flip-flop 16 may be connected to additional flip-flops (not shown) as required.

Figure 2:
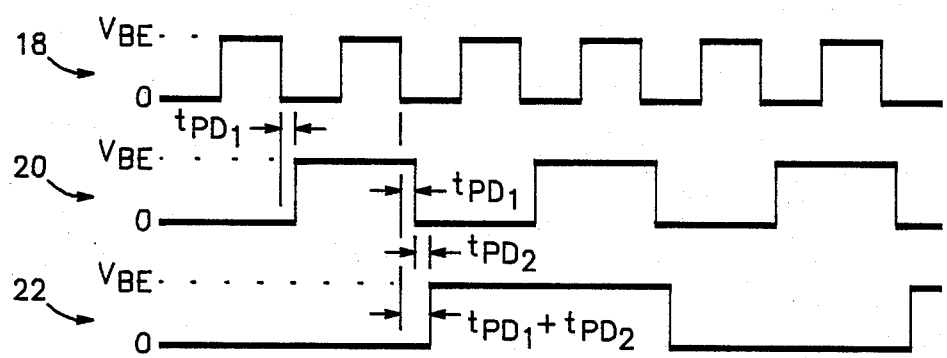
FIG. 2 is a timing diagram illustrating the operation of the counter circuit of FIG. 1.

Referring to FIG. 2, waveform 18 illustrates a typical clock signal applied to input terminal 14. Waveforms 20, 22 illustrate the output Q of flip-flops 12, 16, respectively. When a downward transition occurs on waveform 18 and flip-flop 12 is "clocked", the output Q of flip-flop 12, waveform 20, will transition upward after propagation delay $t_{PD1}$. On the next downward transition of waveform 18, waveform 20 will transition downward after the propagation delay $t_{PD1}$, thereby clocking flip-flop 16, causing waveform 22 to transition upward after another propagation delay $t_{PD2}$ associated with flip-flop 16. Therefore, output Q of flip-flop 16 of the known circuit, includes a total propagation delay $t_{PD}$ equal to $t_{PD1} + t_{PD2}$.

Figure 3:
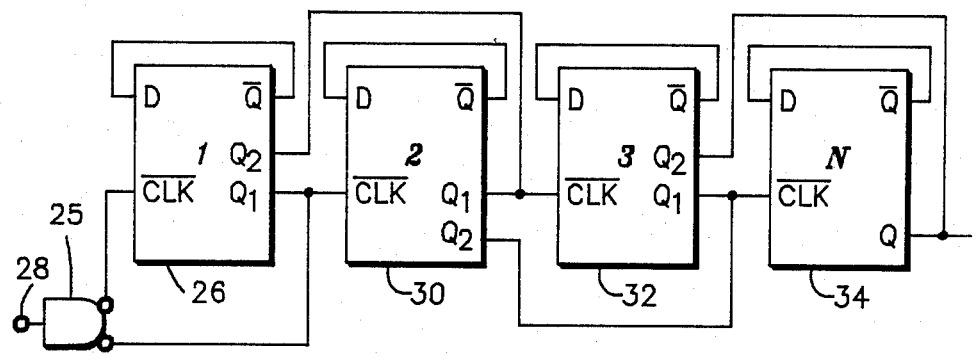
FIG. 3 is a block diagram of the ripple counter circuit of the present invention.

Referring now to FIG. 3, flip-flop circuit 24 is shown which is suitable to be fabricated in monolithic integrated circuit form as well as with discrete components. Circuit 24 includes NAND gate 25 having an input connected to terminal 28 and responsive to a clock signal. Flip-flop 26 has a clock input $\overline{CLK}$ connected to one output of NAND gate 25. Flip-flop 30 has a clock input $\overline{CLK}$ wired ANDed to output Q$_1$ of flip-flop 26 and another output of NAND gate 25. Flip-flop 32 has a clock input $\overline{CLK}$ wired ANDed to output Q$_1$ of flip-flop 30 and output Q$_2$ of flip-flop 26. Additional flip-flops may be connected in a similar manner as shown in the drawing by N flip-flop 34. Each additional serially connected flip-flop has its clock input $\overline{CLK}$ responsive to the wire ANDed signals from the output Q$_1$ of the preceding flip-flop and the output Q$_2$ of the twice preceding flip-flop. Flip-flops 26, 30, 32, 34 each have an output $\overline{Q}$ connected to its respective input D.

Figure 4:
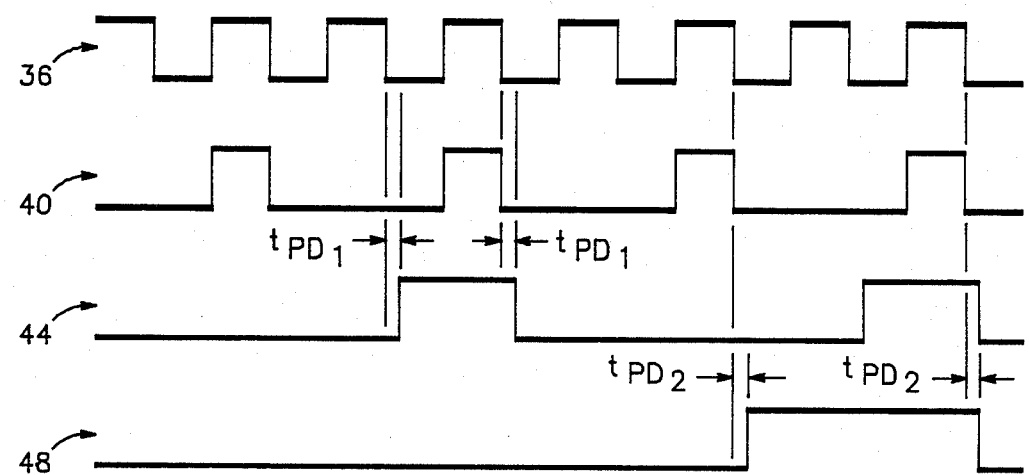
FIG. 4 is a timing diagram illustrating the operation of the ripple counter circuit of the present invention.

Referring to FIG. 4, waveform 36 illustrates the signal at the output of the NAND gate 25. Waveform 40 illustrates the signal applied to clock input $\overline{CLK}$ of flip-flop 30. This signal is the wired AND of the signal from NAND gate 25 and the output Q$_1$ from flip-flop 26. Therefore, waveform 40 will transition downward when waveform 36 transitions downward, regardless of the propagation delay of flip-flop 26.

Waveform 44 illustrates the clock input $\overline{CLK}$ to flip-flop 32 and is the result of the wired AND of output Q$_1$ of flip-flop 30 and Q$_2$ of flip-flop 26. Therefore waveform 44 transitions downward with a propagation delay of T$_{PD1}$. Comparing this result with the circuit and waveforms of FIGS. 1 and 2 respectively, it may be seen that the propagation delay T$_{PD2}$ has been avoided. Waveform 48 illustrates the clock input $\overline{CLK}$ signal to flip-flop 34 and is the result of the wired AND of output Q₁ of flip-flop 32 and output Q₂ of flip-flop 30. Waveform 48 has a propagation delay of only $T_{PD2}$. Therefore, for example, the output of flip-flop circuit 24 will have only two propagation delays for four flip-flops and four propagation delays for eight flip-flops, wherein the prior art circuit 10 of FIG. 1 had delays of four and eight, respectively. It is to be understood that the invention may be applied to as few as two flip-flops.

By now it should be appreciated that there has been provided an improved ripple counter circuit that may be used in programmable counters. This ripple counter circuit reduces the propagation delays inherently induced by the flip-flops, therefore reducing the amount of current required to drive the circuit at a required speed.

I claim:

1. A ripple counter circuit having reduced propagation delay comprising a plurality of flip-flops, each flip-flop having a clock input, a first output, and a second output, wherein said clock input of a first flip-flop is responsive to a clock signal, said clock input of a second flip-flop is coupled to said first output of said first flip-flop and said clock signal, each subsequent flip-flop of said plurality of flip-flops having its clock input coupled only to the first output of the preceding flip-flop and the second output of the next preceding flip-flop.

2. The ripple counter circuit according to claim 1 wherein said first and second outputs are substantially similar in phase.

3. A ripple counter circuit comprising:
   a first flip-flop having a clock input responsive to a clock signal, a $Q_1$ output, a $\overline{Q}$ output, and a D input coupled to said $\overline{Q}$ output;
   a second flip-flop having a clock input coupled to said $Q_1$ output of said first flip-flop and responsive to said clock signal, said second flip-flop having a $Q_1$ output, a $Q_2$ output substantially similar in phase to said $Q_1$ output, a $\overline{Q}$ output, and a D input coupled to said $\overline{Q}$ output of said second flip-flop; and
   a plurality of flip-flops, each of said plurality of flip-flops serially connected to said second flip-flop, each having a $\overline{Q}$ output, a $Q_1$ output, a $Q_2$ output, a D input coupled to a $\overline{Q}$ output, and a clock input coupled to said $Q_1$ output of the preceding flip-flop and to the $Q_2$ output of the next preceding flip-flop.

4. A ripple counter circuit including at least a first flip-flop, a second flip-flop, and a third flip-flop, said first flip-flop having a first output, a second output, and a clock input, said clock input responsive to a first clock signal, said second flip-flop having a clock input and an output, comprising the improvement wherein said first output of said first flip-flop and said first clock signal are ANDed to provide a second clock signal to said clock input of said second flip-flop, and said second output of said first flip-flop and said output of said second flip-flop are ANDed to provide a third clock signal to said clock input of said third flip-flop.

* * * * *